US008985748B2

(12) United States Patent
Nakakubo

(10) Patent No.: US 8,985,748 B2
(45) Date of Patent: Mar. 24, 2015

(54) LIQUID EJECTION HEAD AND METHOD OF MANUFACTURING LIQUID EJECTION HEAD

(71) Applicant: Canon Kabushiki Kaisha, Tokyo (JP)

(72) Inventor: Toru Nakakubo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/915,758

(22) Filed: Jun. 12, 2013

(65) Prior Publication Data

US 2013/0342612 A1 Dec. 26, 2013

(30) Foreign Application Priority Data

Jun. 22, 2012 (JP) ................................ 2012-140703

(51) Int. Cl.
*B41J 2/045* (2006.01)
*H01L 41/22* (2013.01)
*B41J 2/14* (2006.01)
*B41J 2/16* (2006.01)

(52) U.S. Cl.
CPC ............ *B41J 2/14201* (2013.01); *B41J 2/1626* (2013.01); *B41J 2/14209* (2013.01); *B41J 2/1609* (2013.01); *B41J 2/1623* (2013.01); *B41J 2/1631* (2013.01); *B41J 2/1634* (2013.01); *B41J 2/1642* (2013.01); *B41J 2/1646* (2013.01)
USPC ............................... 347/69; 347/71; 29/25.35

(58) Field of Classification Search
None
See application file for complete search history.

(56) References Cited

U.S. PATENT DOCUMENTS

| | | | | |
|---|---|---|---|---|
| 8,191,994 | B2 | 6/2012 | Nakakubo et al. | |
| 2007/0018540 | A1 * | 1/2007 | Seto | 310/369 |
| 2013/0093819 | A1 | 4/2013 | Nakakubo et al. | |
| 2013/0162725 | A1 | 6/2013 | Suzuki et al. | |

FOREIGN PATENT DOCUMENTS

| | | | | |
|---|---|---|---|---|
| JP | 2007-168319 | A | 7/2007 | |
| WO | WO 2011/155129 | A1 * | 12/2011 | B41J 2/14 |

* cited by examiner

*Primary Examiner* — Geoffrey Mruk
(74) *Attorney, Agent, or Firm* — Fitzpatrick, Cella, Harper & Scinto

(57) ABSTRACT

Provided is a liquid ejection head, including: multiple ejection orifices for ejecting liquid; multiple pressure chambers that communicate with the respective ejection orifices, and are arranged in a first direction and a second direction that intersect each other, the multiple pressure chambers including first electrodes formed on inner walls of the multiple pressure chambers; a piezoelectric block including the multiple pressure chambers and multiple air chambers, the multiple air chambers being arranged in the first direction and the second direction alternately with the multiple pressure chambers, the inner walls of the respective pressure chambers being deformable by application of voltage between the first electrodes and the second electrodes to cause liquid to flow out of open ends of the respective pressure chambers; an orifice plate in which the multiple ejection orifices are arranged; and a plate-like member that is interposed between the piezoelectric block.

6 Claims, 22 Drawing Sheets

LIQUID EJECTION HEAD AND METHOD OF MANUFACTURING LIQUID EJECTION HEAD

BACKGROUND OF THE INVENTION

1. Field of the Invention

The present invention relates to a liquid ejection head that ejects liquid and a method of manufacturing the same.

2. Description of the Related Art

A liquid ejection head for ejecting ink is generally mounted onto an ink jet recording apparatus for recording an image on a recording medium by ejecting the ink. As a mechanism for causing the liquid ejection head to eject ink, there is known a mechanism using a pressure chamber that is shrinkable in volume by a piezoelectric element. In this mechanism, the pressure chamber shrinks due to the deformation of the piezoelectric element to which a voltage is applied, and thus the ink inside the pressure chamber is ejected from an ejection orifice communicated to one end of the pressure chamber. As one liquid ejection head including such a mechanism, there is known a so-called shear mode type in which one or two inner wall surfaces of the pressure chamber are formed of the piezoelectric element, and the pressure chamber is caused to shrink by shear deformation of the piezoelectric element instead of extension or contraction deformation thereof.

Regarding ink jet apparatus for industrial applications or the like, there is a demand for use of high viscosity liquid. In order to eject high viscosity liquid, a large ejection force is required for the liquid ejection head. To satisfy this demand, there has been proposed a liquid ejection head called a Gould type, in which the pressure chamber is formed of a tubular piezoelectric member having a circular or rectangular sectional shape. In the Gould type liquid ejection head, the piezoelectric member extends or is deformed by contraction in the inward and outward directions (radial direction) about the center of the pressure chamber. In this manner, the pressure chamber expands or shrinks. In the Gould type liquid ejection head, the entire wall surface of the pressure chamber deforms, and this deformation contributes to the ink ejection force. Therefore, as compared to the shear mode type in which one or two wall surfaces are formed of the piezoelectric element, a larger ink jet force can be obtained. The method of manufacturing a Gould type liquid ejection head is disclosed in Japanese Patent Application Laid-Open No. 2007-168319.

In the manufacturing method disclosed in Japanese Patent Application Laid-Open No. 2007-168319, first, multiple grooves all extending in the same direction are formed in each of multiple piezoelectric plates. After that, the multiple piezoelectric plates are stacked so that the grooves are directed in the same direction, and are cut in a direction orthogonal to the direction of the grooves. The groove part of the cut piezoelectric plate forms an inner wall surface of the pressure chamber. After that, in order to separate the respective pressure chambers, the piezoelectric member present between the pressure chambers is removed to a certain depth. On upper and lower sides of the piezoelectric plate having the completed pressure chambers, a supply path plate and an ink pool plate, and a printed circuit board and an ejection orifice plate are respectively connected. In this manner, the liquid ejection head is completed. With this manufacturing method disclosed in Japanese Patent Application Laid-Open No. 2007-168319, the pressure chambers can be arranged in matrix, and hence the pressure chambers can be arranged in high density. Further, with this manufacturing method, because forming a groove in the piezoelectric plate is better in processing than opening a hole in the piezoelectric plate, the pressure chambers can be formed with high accuracy.

A technology of staggering multiple ejection orifices in a specific direction is known as a way to accomplish high-density recording with a liquid ejection head. In the liquid ejection head of Japanese Patent Application Laid-Open No. 2007-168319, however, the pressure chambers are arranged in two directions that intersect each other at right angles. If the technology is applied to this liquid ejection head, the liquid ejection head may not be able to eject ink from the ejection orifices because how the ejection orifices are arranged does not match how the pressure chambers are arranged.

SUMMARY OF THE INVENTION

The present invention has been made in view of the above, and an object of the present invention is therefore to provide a liquid ejection head capable of ejecting liquid from ejection orifices irrespective of a mismatch between how the ejection orifices are arranged and how pressure chambers are arranged, and a method of manufacturing the liquid ejection head.

In order to achieve the above-mentioned object, according to an exemplary embodiment of the present invention, there is provided a liquid ejection head, including:

multiple ejection orifices for ejecting liquid;

multiple pressure chambers that communicate with the respective ejection orifices, and are arranged in a first direction and a second direction that intersect each other, the multiple pressure chambers including first electrodes formed on inner walls of the multiple pressure chambers;

a piezoelectric block including the multiple pressure chambers and multiple air chambers, the multiple air chambers being arranged in the first direction and the second direction alternately with the multiple pressure chambers, the multiple air chambers including second electrodes formed on inner walls of the multiple air chambers, the inner walls of the respective pressure chambers being deformable by application of voltage between the first electrodes and the second electrodes to cause liquid to flow out of open ends of the respective pressure chambers;

an orifice plate in which the multiple ejection orifices are arranged; and a plate-like member that is interposed between the piezoelectric block and the orifice plate and is pierced by multiple flow paths, the multiple flow paths allowing the open ends of the respective pressure chambers to communicate individually to the respective ejection orifices.

Further features of the present invention will become apparent from the following description of exemplary embodiments with reference to the attached drawings.

DESCRIPTION OF THE EMBODIMENTS (Embodiment 1)

Figure 1:
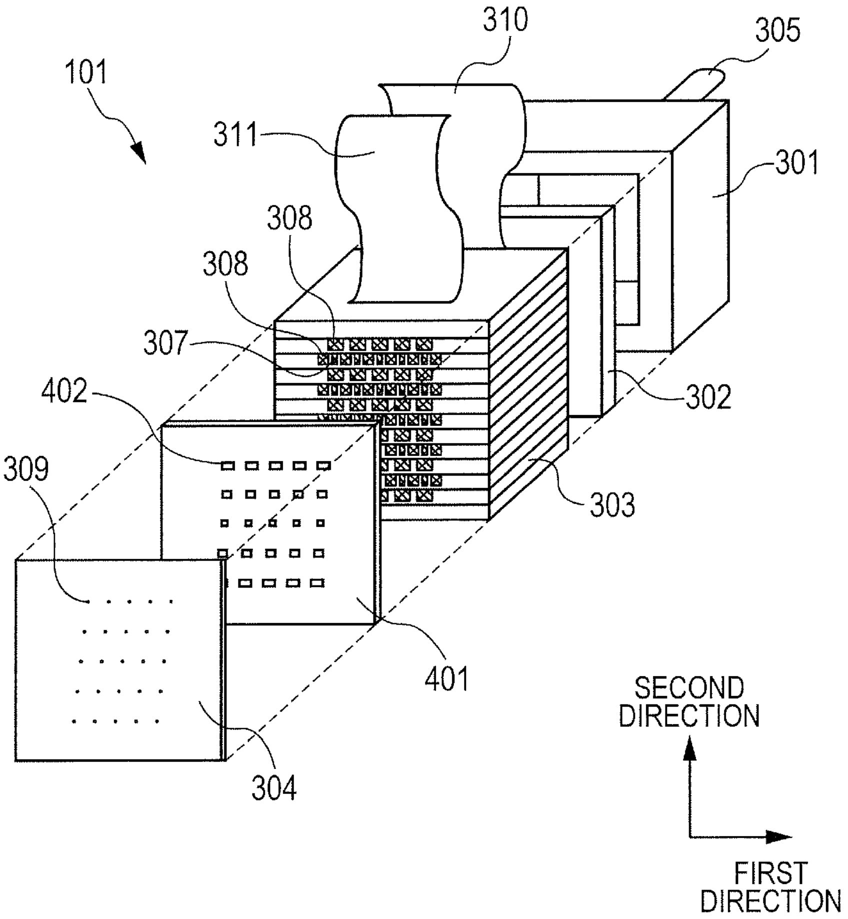
FIG. 1 is an exploded perspective view of a liquid ejection head according to Embodiment 1 of the present invention.
Figure 2:
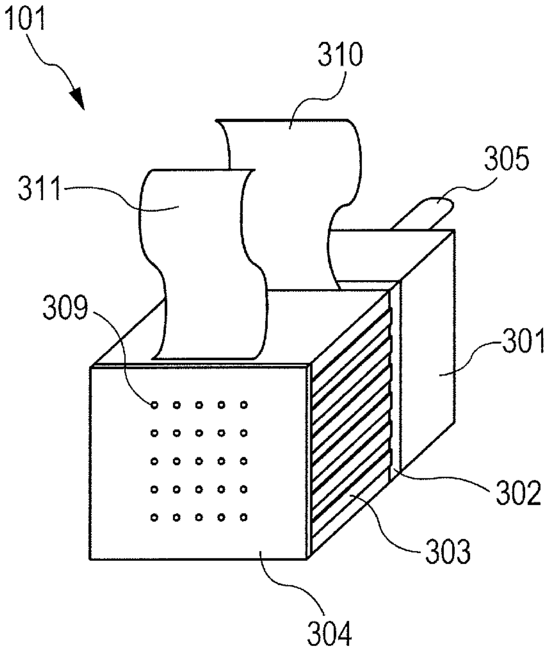
FIG. 2 is a perspective view of the liquid ejection head of FIG. 1.

Embodiment 1 of the present invention is described. FIG. 1 is an exploded perspective view of a liquid ejection head according to Embodiment 1. FIG. 2 is a perspective view of the liquid ejection head of FIG. 1. In the liquid ejection head of FIGS. 1 and 2 that is denoted by 101, an orifice plate 304, a plate-like member 401, a piezoelectric block 303, which is made of a piezoelectric material, a rear throttle plate 302, and a common liquid chamber 301 are stacked on top of one another. The piezoelectric block 303 is provided with multiple pressure chambers 307 whose side walls are made of a piezoelectric material, and multiple air chambers 308. The common liquid chamber 301 communicates to each pressure chamber 307 of the piezoelectric block 303 via the rear throttle plate 302. Wiring lines from the piezoelectric block 303 to the outside are led out from the piezoelectric block 303 by a first flexible cable 310 and a second flexible cable 311. Multiple ejection orifices 309 from which pressurized ink (liquid) is ejected are formed in the orifice plate 304. The ejection orifices 309 individually communicate with the pressure chambers 307 via flow paths 402 that pierce the inside of the plate-like member 401.

Figure 3:
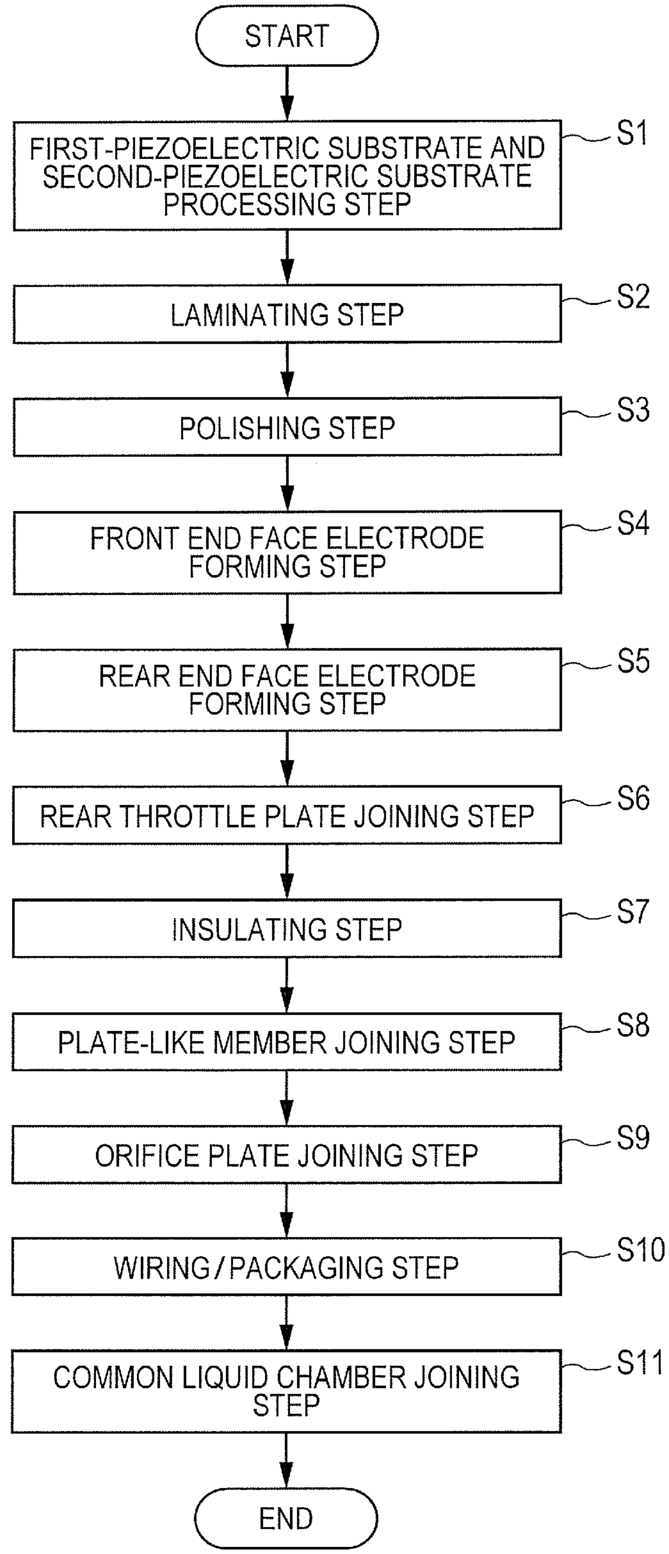
FIG. 3 is a flow chart illustrating steps of manufacturing the liquid ejection head according to Embodiment 1 of the present invention.

A method of manufacturing the liquid ejection head of this embodiment is described below. FIG. 3 is a flow chart illustrating steps of manufacturing the liquid ejection head according to this embodiment.

Figure 4:
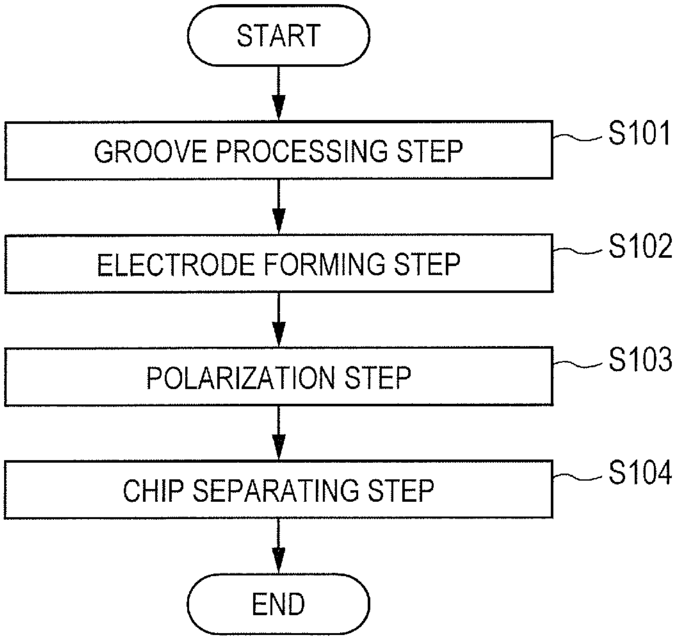
FIG. 4 is a flow chart illustrating steps of a first-piezoelectric substrate processing step.
Figure 5:
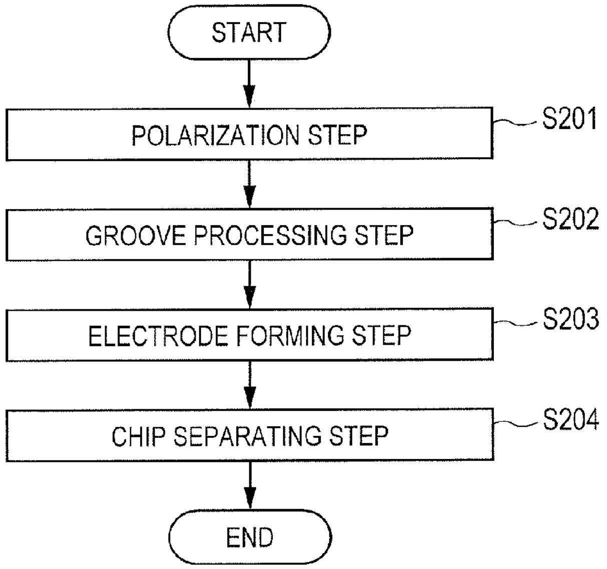
FIG. 5 is a flow chart illustrating steps of a second-piezoelectric substrate processing step.

A first-piezoelectric substrate processing step and a second-piezoelectric substrate processing step (Step S1) are described first. FIG. 4 is a flow chart illustrating steps of the first-piezoelectric substrate processing step. FIG. 5 is a flow chart illustrating steps of the second-piezoelectric substrate processing step. The first-piezoelectric substrate processing step is described first.

As illustrated in FIG. 4, the first-piezoelectric substrate processing step includes a groove processing step (Step S101), an electrode forming step (Step S102), a polarization step (Step S103), and a chip separating step (Step S104).

Figure 6:
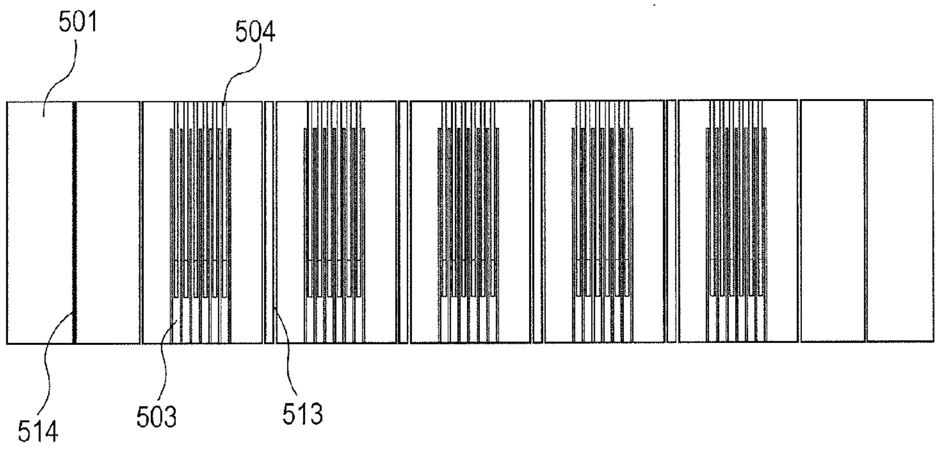
FIG. 6 is a diagram illustrating the first-piezoelectric substrate processing step.

FIG. 6 and FIGS. 7A to 7H are diagrams illustrating the first-piezoelectric substrate processing step. FIG. 6 illustrates five sets of first grooves 503 and second grooves 504 that correspond to five nozzles made up of the pressure chambers 307 and the air chambers 308. FIGS. 7A to 7H illustrate one set of the first grooves 503 and the second grooves 504.

(Groove Processing Step)

Figure 7A:
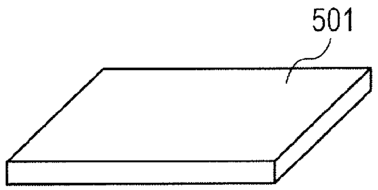
FIGS. 7A, 7B, 7C, 7D, 7E, 7F, 7G, and 7H are diagrams illustrating the first-piezoelectric substrate processing step.

The groove processing step (Step S101) is described. FIG. 7A illustrates a first piezoelectric substrate 501 having a flat plate shape. The first piezoelectric substrate 501 can be, for example, a lead zirconate titanate (PZT) substrate. First exposure-use alignment grooves 514 (see FIG. 6) are formed in the first piezoelectric substrate 501 by grinding that uses a super abrasive wheel. The first exposure-use alignment grooves 514 may be positioned based on the distance from one end of the first piezoelectric substrate 501, or may be positioned with the use of a metal pattern or the like that is formed by photolithography to serve as a guide.

Figure 7B:
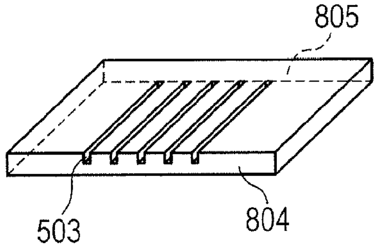

FIG. 7B illustrates the first piezoelectric substrate 501 in which multiple first grooves 503 have been formed. The first grooves 503 respectively function as the pressure chambers 307 described above. As illustrated in FIG. 7B, the first grooves 503 are open-ended on a first side face 804, and are closed-ended on a second side face 805, which is opposite from the first side face 804. In the groove processing step, first alignment grooves for joining 513 (see FIG. 6) that serve as an alignment guide in the chip separating step are formed as well.

Figure 7C:
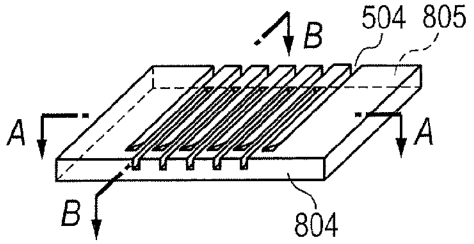

FIG. 7C illustrates the first piezoelectric substrate 501 in which multiple second grooves 504 have been formed. The second grooves 504 are side by side with and alternate with the first grooves 503. The second grooves 504 are closed-ended on the first side face 804, and are open-ended on the second side face 805. The second grooves 504 run parallel to the first grooves 503 and function as the air chambers 308 described above.

(Electrode Forming Step)

Figure 7D:
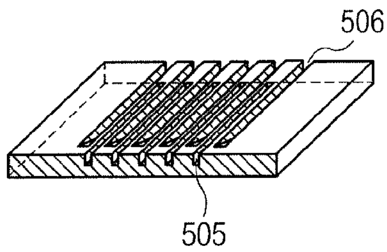

The electrode forming step (Step S102) is described. FIG. 7D illustrates the first grooves 503 in which first electrodes 505 have been formed and the second grooves 504 in which second electrodes 506 have been formed. The first electrodes 505 and the second electrodes 506 are formed by patterning that uses lift-off, or by patterning that uses a laser or polishing, or by other methods. FIGS. 8A to 8H are sectional views illustrating an electrode patterning method that uses lift-off.

FIGS. 8A to 8D are sectional views taken along the line A-A of FIG. 7C. FIGS. 8E to 8H are sectional views taken along the line B-B of FIG. 7C.

Figure 8A:
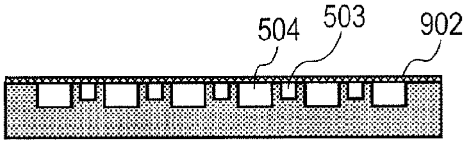
FIGS. 8A, 8B, 8C, 8D, 8E, 8F, 8G, and 8H are sectional views illustrating an electrode patterning method that uses lift-off.

FIG. 8A illustrates the first piezoelectric substrate 501 on which a film resist 902 has been stacked. FIG. 8B illustrates the film resist 902 that has been patterned by exposure and development. In lift-off, a resist pattern is formed by photolithography so that the resist remains in parts where the electrode pattern is not to be left. FIG. 8C illustrates a metal layer formed on the substrate by sputtering or vapor deposition to form electrodes. FIG. 8D illustrates the substrate from which the resist has been removed. Removing the resist causes the metal film formed on the resist to peel off along with the resist and, ultimately, a desired metal film pattern is obtained.

An electrode patterning method that uses a laser or polishing is described. First, a metal film is formed on the first piezoelectric substrate 501 through sputtering, vapor deposition, electroless plating, or the like. At this point, the metal film is formed on the first side face 804 and the second side face 805 as well. An unnecessary part of the metal film is then removed with the use of a laser or by polishing, and a desired electrode pattern is thus obtained. The first electrodes 505 and the second electrodes 506 establish electrical connection to each other via the parts of the metal film that are formed on the first side face 804 and the second side face 805.

Figure 7E:
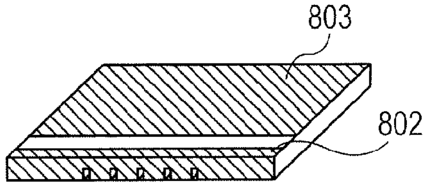

FIG. 7E illustrates a rear face of the first piezoelectric substrate 501 (a face opposite from the one where the first grooves 503 and the second grooves 504 are formed) on which first common wiring 802 and second common wiring 803 have been formed. The first common wiring 802 and the second common wiring 803 are made from a metal film. The first common wiring 802 and the second common wiring 803 are divided from each other in a direction in which the first grooves 503 are arranged. The first common wiring and the second common wiring can be patterned by lift-off or etching of a photo resist that uses photolithography, or other similar methods. The first common wiring and the second common wiring can also be patterned by removing an unnecessary part with the use of a laser, or through dicing or milling. A step of patterning the first common wiring 802 and the second common wiring 803 by lift-off that uses photolithography is described with reference to FIGS. 8E to 8H.

Figure 8E:
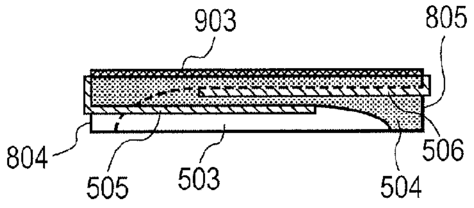
Figure 8B:
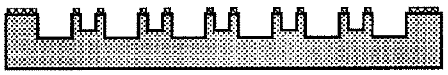
Figure 8F:
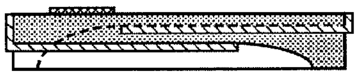
Figure 8C:
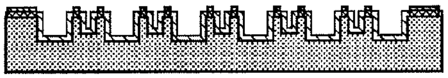
Figure 8G:
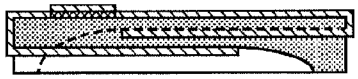
Figure 8D:
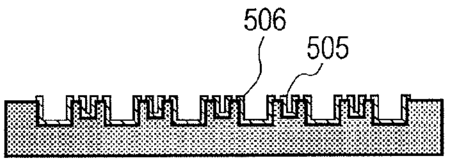
Figure 8H:
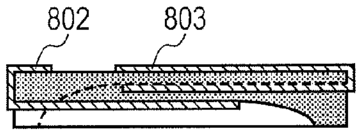

A film of a second resist 903 is formed over the entire rear face of the first piezoelectric substrate 501 (see FIG. 8E). The resist 903 is subsequently patterned (see FIG. 8F). A metal film is then formed on the patterned resist 903 and the rear face of the piezoelectric substrate 501 (see FIG. 8G). Lastly, the resist 903 is removed (see FIG. 8H).

The first common wiring 802 is electrically connected to the first electrodes 505 and the second electrodes 506 via the first side face 804. The second common wiring 803, on the other hand, is electrically connected to the first electrodes 505 and the second electrodes 506 via the second side face 805.

(Polarization Step)

Figure 7F:
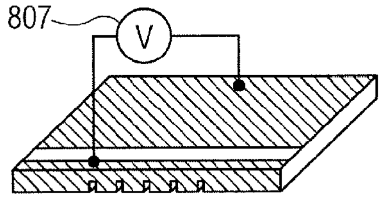

The polarization step (Step S103) is described. FIG. 7F is a diagram illustrating the polarization step. In the polarization step, a high voltage is applied between the first common wiring 802 and the second common wiring 803. At this point, the first electrodes 505 have a positive electric potential and the second electrodes 506 have a ground electric potential. The temperature condition is about 100 to 150° C., and the voltage condition is about 1 to 2 kV/mm. Polarization is desired to be performed in oil that is highly insulative (for example, silicone oil that is 10 kV/mm or more in dielectric breakdown voltage) in order to prevent atmospheric discharge and creeping discharge. Silicone oil can be removed after the polarization step with a hydrocarbon-based solvent such as xylene, benzene, or toluene, or a chlorinated hydrocarbon-based solvent such as methyl chloride, 1.1.1-trichloroethane, or chlorobenzene.

Aging processing may be performed after the polarization step. Specifically, the first piezoelectric substrate 501 on which polarization has been performed is kept at a raised temperature for a given period of time. The piezoelectric characteristics of the first piezoelectric substrate 501 are stabilized in this manner.

(Chip Separating Step)

Figure 7G:
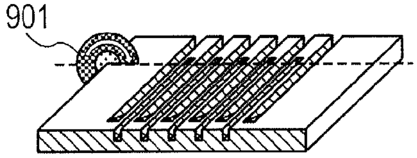

The chip separating step (S104) is described. FIG. 7G is a diagram illustrating the chip separating step. In the chip separating step, the first piezoelectric substrate 501 is cut with a super abrasive wheel 901 as illustrated in FIG. 7G. Dicing, polishing, and laser abrasion can be given as other cutting method examples. The first grooves 503 need to be closed at both ends in order to function as the pressure chambers 307. In this step, the first piezoelectric substrate 501 is cut in the manner illustrated in FIG. 7G, with the result that the multiple second electrodes 506 are electrically isolated from one another and are also electrically isolated from the second common wiring 803.

Figure 7H:
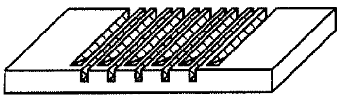

A step illustrated in FIG. 7H is a step of removing the part of the first common wiring 802 that is formed on the first side face 804. Dicing, polishing, and laser abrasion can be given as removal method examples. Removing the part of the first common wiring 802 that is formed on the first side face 804 renders the multiple first electrodes 505 electrically isolated from one another. In the chip separating step, the five sets of piezoelectric substrates of FIG. 6 are cut off for every five nozzles. Five chips are thus cut out of the first piezoelectric substrate 501.

In the first-piezoelectric substrate processing step described above, polarization can be performed with the second grooves 504, which function as the air chambers 308, closed on the first side face 804.

The second-piezoelectric substrate processing step is described next. As illustrated in FIG. 5, the second-piezoelectric substrate processing step includes a polarization step (Step S201), a groove processing step (Step S202), an electrode forming step (Step S203), and a chip separating step (Step S204).

(Polarization Step)

The polarization step (Step S201) is described. A second piezoelectric substrate 502 can be a PZT substrate as is the case for the first piezoelectric substrate 501. In the step of processing the first piezoelectric substrate 501, the polarization step is executed after the groove processing step as illustrated in FIGS. 7A to 7H. In the step of processing the second piezoelectric substrate 502, on the other hand, the polarization step is conducted before the groove processing step. The polarization step is a step of respectively forming electrodes over the entire front face and rear face of the piezoelectric substrate having a flat plate shape, and applying a high electric field of about 1 to 2 kV/mm between the electrodes for a given period of time while the substrate is heated at about 100 to 150° C. Through the polarization, the piezoelectric substrate is polarized uniformly in a direction perpendicular to the principle surface of the piezoelectric substrate. The polarization may be conducted in insulative oil as is the case for the first piezoelectric substrate 501, or in the air. The electrodes are removed from the front face by etching or polishing after the polarization.

(Groove Processing Step)

Figure 9:
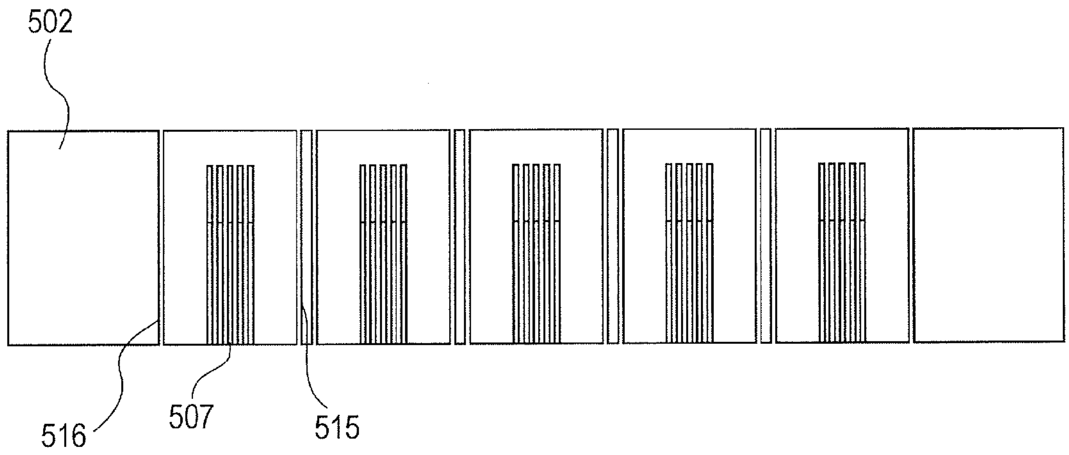
FIG. 9 is a plan view of how the second piezoelectric substrate looks after groove processing is performed.

The groove processing step (Step S202) is described. FIG. 9 is a plan view illustrating the second piezoelectric substrate 502 on which groove processing has been performed. In FIG.

9, five sets of grooves are disposed to serve as the air chambers 308 that correspond to five nozzles. However, only one out of the five sets is discussed and illustrated in the following description of steps and drawings referred to in the description.

FIG. 9 illustrates second exposure-use alignment grooves 516 that are formed by grinding that uses a super abrasive wheel. The groove processing step uses the second exposure-use alignment grooves 516 as a reference for processing. The second exposure-use alignment grooves 516 may be positioned based on the distance from an end of the substrate, or may be positioned with the use of a metal pattern or the like that is formed by photolithography to serve as a guide.

Figure 10A:
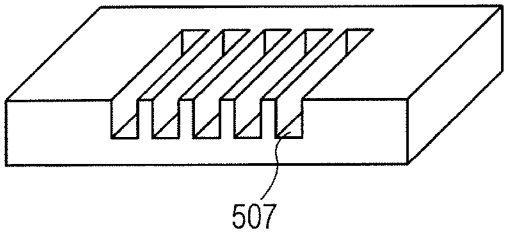
FIGS. 10A, 10B, 10C, and 10D are perspective views illustrating steps of the second-piezoelectric substrate processing step that follow the groove processing step.

FIGS. 10A to 10D are perspective views illustrating steps of the second-piezoelectric substrate processing step that follow the groove processing step. FIG. 10A illustrates the second piezoelectric substrate 502 in which multiple third grooves 507 have been formed. The third grooves 507 function as the air chambers 308 that are adjacent to the pressure chambers 307 described above. In this embodiment, the third grooves 507 that are closed at one end in the longitudinal direction are formed by pulling up the super abrasive wheel 901 away from the piezoelectric substrate during grinding at some points on the piezoelectric substrate.

(Electrode Forming Step)

Figure 10B:
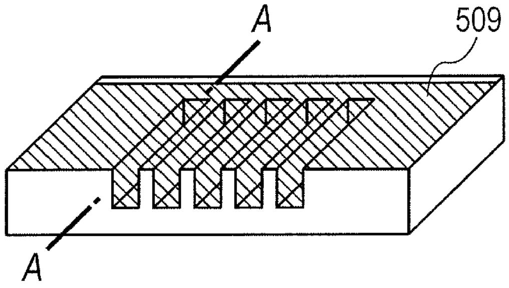

FIG. 10B illustrates the third grooves 507 in which a fourth electrode 509 has been formed. The fourth electrode 509 has the same polarity as that of the second electrodes 506. It is sufficient if the fourth electrode 509 is formed on at least the bottom faces of the third grooves 507, and an electrode formed over the entire surface of the third grooves 507 may be used as the fourth electrode 509. The fourth electrode 509 can be patterned by lift-off or polishing, or with the use of a laser.

Figure 11A:
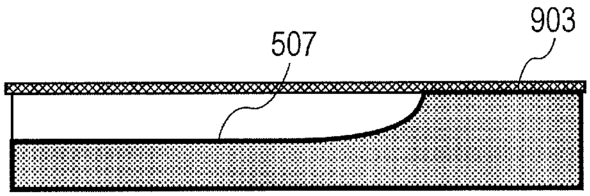
FIGS. 11A, 11B, 11C, and 11D are sectional views illustrating another electrode patterning method that uses lift-off.
Figure 11B:
Figure 11C:
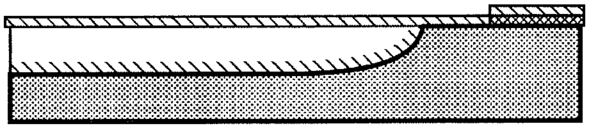
Figure 11D:
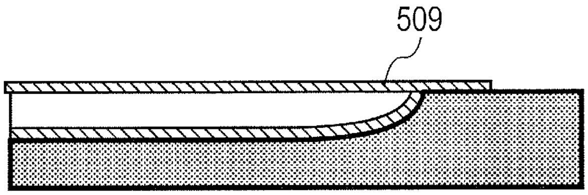

FIGS. 11A to 11D are sectional views illustrating an electrode patterning method that uses lift-off. The sectional views of FIGS. 11A to 11D are taken along the line A-A of FIG. 10B. FIG. 11A illustrates the second piezoelectric substrate 502 on which the film resist 903 has been stacked. FIG. 11B illustrates the film resist 903 on which a resist pattern has been formed by photolithography so that the resist remains in parts where the electrode pattern is not to be left. FIG. 11C illustrates a metal layer formed on the substrate by sputtering or vapor deposition to form electrodes. FIG. 11D illustrates the substrate from which the resist has been removed. Removing the resist causes the metal film formed on the resist to peel off along with the resist and, ultimately, a desired metal film pattern is obtained.

The electrodes may also be patterned with the use of a laser or by polishing by the same method that has been described in the description of the electrode forming step (Step S102) that is one of the steps of processing the first piezoelectric substrate 501.

Figure 10C:
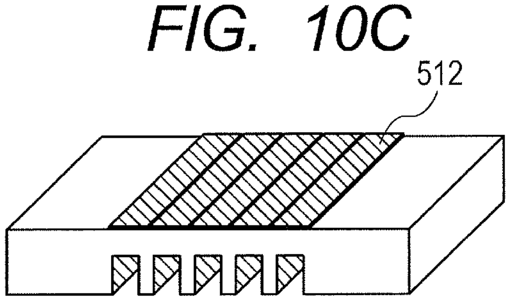

FIG. 10C illustrates the second piezoelectric substrate 502 having a rear face on which a fifth electrode 512 has been formed from a metal film (the rear face of the second piezoelectric substrate 502 is a face opposite from the one where the third grooves 507 are formed). The pattern of the fifth electrode 512 is divided along borders between the third grooves 507. The fifth electrode 512 can be patterned by lift-off or etching of a photo resist that uses photolithography, or other similar methods. The fifth electrode 512 can also be patterned by removing an unnecessary part with the use of a laser, or through dicing or milling.

(Chip Separating Step)

Figure 10D:
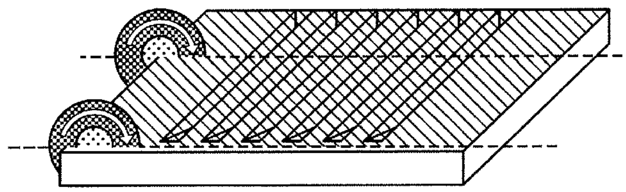

The chip separating step (Step S204) is described. FIG. 10D is a diagram illustrating the chip separating step. In the chip separating step, a part of the second piezoelectric substrate 502 is cut. Dicing, polishing, and laser abrasion can be given as cutting method examples. In this embodiment, the second piezoelectric substrate 502 is cut so that the third grooves 507 are closed on one side face. The second piezoelectric substrate 502 is cut into pieces for every five nozzles similarly to the first piezoelectric substrate 501. Five chips are thus cut out of the second piezoelectric substrate 502.

(Stacking Step)

A stacking step (Step S2) is described next with reference to FIGS. 12A and 12B. The first grooves 503 and the second grooves 504 have been formed in the first piezoelectric substrate 501 through the first-piezoelectric substrate processing step and the second-piezoelectric substrate processing step (Step S1) described above. The first electrodes 505 are formed on the inner walls of the first grooves 503 and the second electrodes 506 are formed on the inner walls of the second grooves 504. A third electrode 508 is formed on the rear face of the first piezoelectric substrate 501. In the second piezoelectric substrate 502, on the other hand, the third grooves 507 are formed and the fourth electrode 509 that is substantially the same as the second electrodes 506 is formed on the inner walls of the third grooves 507. A fifth electrode 512 is formed on the rear face of the second piezoelectric substrate 502.

Figure 12A:
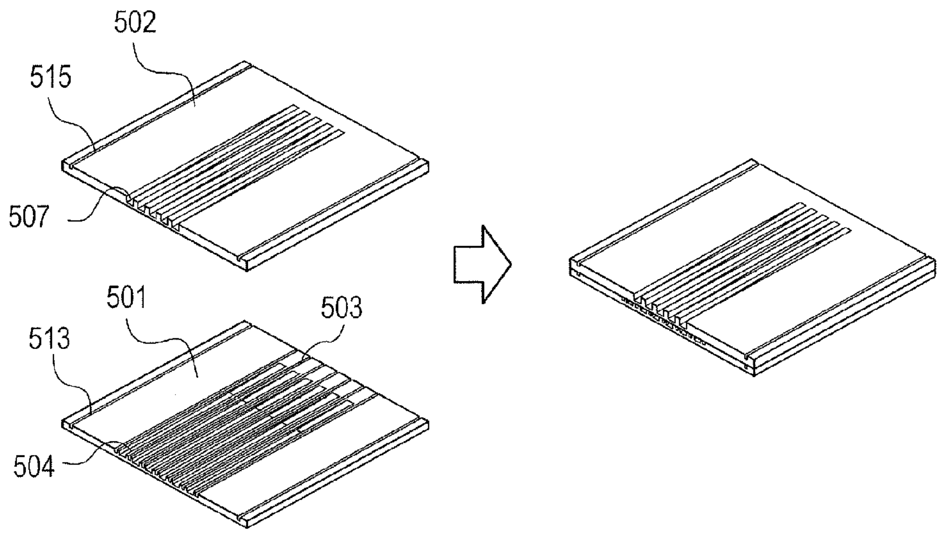
FIGS. 12A and 12B are perspective views illustrating a stacking step.

In the stacking step, one first piezoelectric substrate 501 and one second piezoelectric substrate 502 are first stacked and joined to each other as illustrated in FIG. 12A. The piezoelectric substrates are joined with the use of, for example, an epoxy-based adhesive. In order to avoid filling the grooves formed in the respective piezoelectric substrates with the adhesive, it is desired to control the amount of the adhesive appropriately. The adhesive can be applied by forming a thin uniform adhesive layer on another flat substrate through spin coating, screen printing, or the like, pressing a surface to be joined against the adhesive layer, and then pulling the surface away. A thin uniform adhesive layer is thus formed on one of the piezoelectric substrates. After the adhesive is applied, the piezoelectric substrates are positioned with a minute gap left therebetween substrates, and the piezoelectric substrates are then bonded by pressure bonding.

To align the piezoelectric substrates for the stacking, an end face of each chip cut out of the piezoelectric substrates may be pushed against positioning pins. Alternatively, the piezoelectric substrates may be aligned with the use of a camera in order to improve the positioning accuracy. In the alignment with the aid of a camera, edges of the chips, grooves, alignment marks patterned when the electrodes are formed, or the like can be used as a guide.

In the stacking step, the stacked body of FIG. 12A constitutes one unit and multiple units are stacked and joined to one another. A substrate 510 is joined to the topmost layer of the multiple units (see FIG. 12B), and a substrate 511 is joined to the lowermost layer of the multiple units (see FIG. 12B). The piezoelectric block 303 is manufactured in this manner. The substrate 510 and the substrate 511 are flat plates on which no patterns are formed. The substrate 510 and the substrate 511 do not need to be piezoelectric substrates. In the case where heating is required to join the substrates, the substrate 510 and the substrate 511 are desired to be made from a material that has a thermal expansion coefficient close to those of the first piezoelectric substrate 501 and the second piezoelectric substrate 502. The substrate 510 and the substrate 511 work to correct the overall warping of the stacked piezoelectric substrates.

Figure 12B:
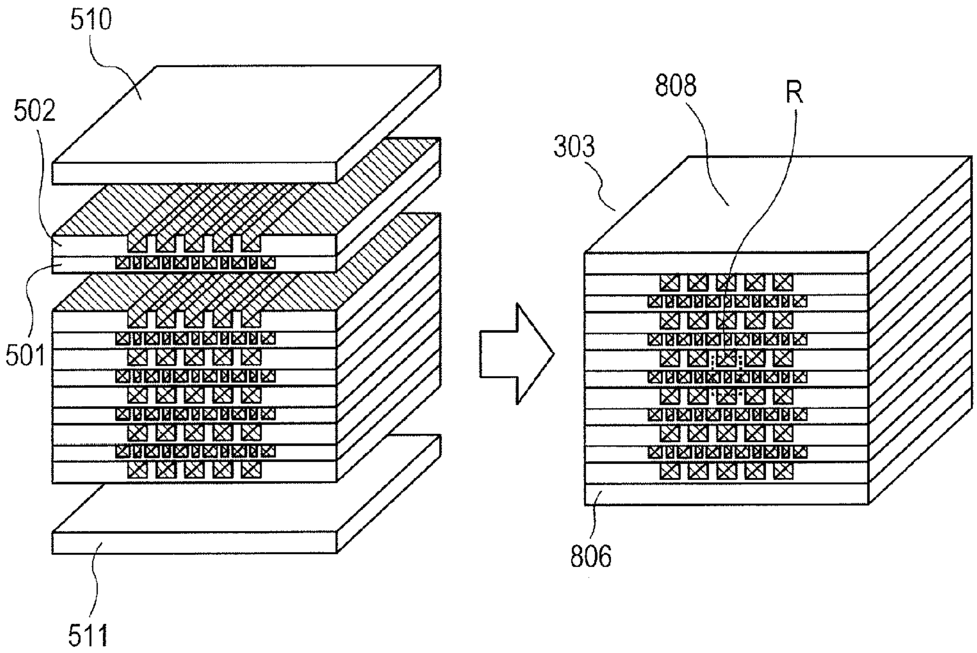
Figure 13:
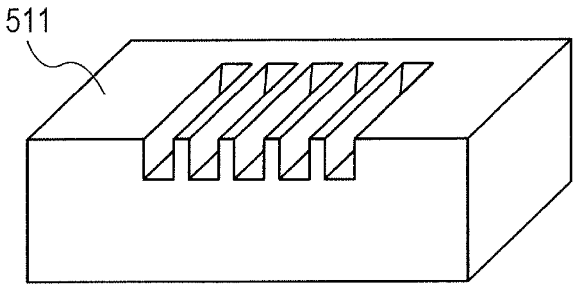
FIG. 13 illustrates another mode of a substrate 511 of FIG. 12B.

FIG. 13 illustrates another mode of the substrate 511 of FIG. 12B. When the substrate 511 of FIG. 13 is used, the second piezoelectric substrate 502 is not placed on the lowermost layer of the stacked body of the first piezoelectric substrate 501 and the second piezoelectric substrate 502. There is no particular need to form electrodes on inner walls of the substrate 511 of FIG. 13.

Figure 14:
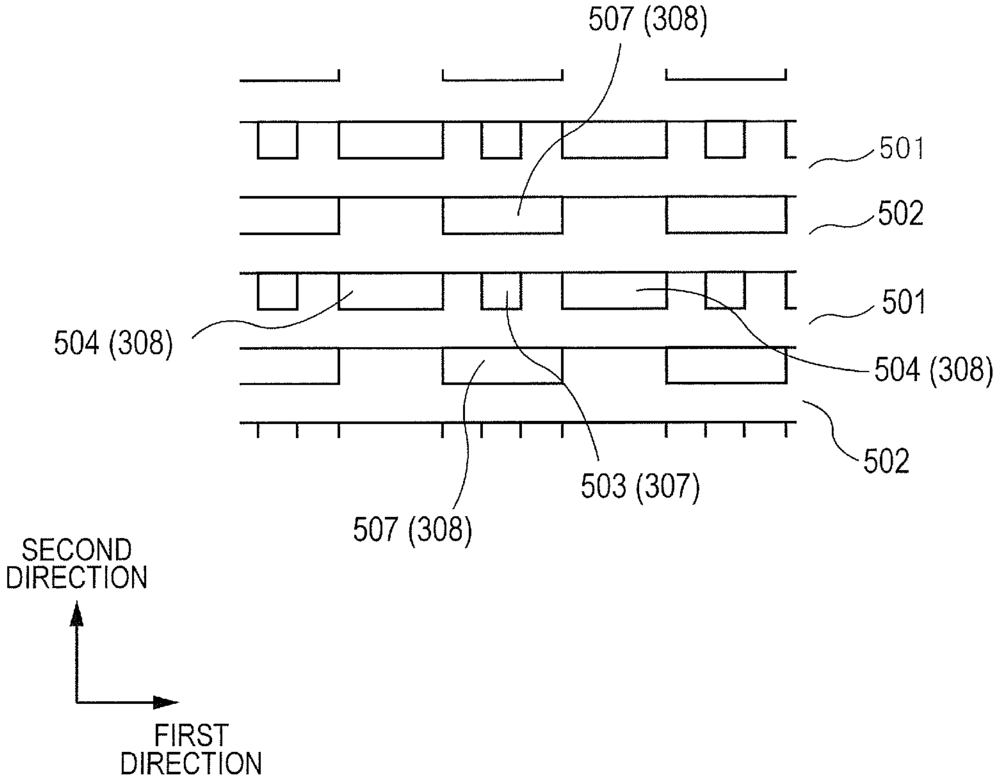
FIG. 14 is a sectional view of a piezoelectric block 303 of FIG. 12B.

FIG. 14 is a sectional view of the piezoelectric block 303 illustrated in FIG. 12B. In the piezoelectric block 303 of FIG. 14, the pressure chambers 307 (the first grooves 503) and the air chambers 308 (the second grooves 504 and the third grooves 507) are arranged in two directions that intersect each other. In the following, one of the two directions that is a direction in which the grooves are arranged in the respective piezoelectric substrates is referred to as "first direction" and the other direction that intersects the first direction is referred to as "second direction". The second direction in this embodiment corresponds to a direction in which the first piezoelectric substrate 501 and the second piezoelectric substrate 502 are stacked. In other words, the second direction in this embodiment intersects the first direction at right angles. In the piezoelectric block 303 of this embodiment, the air chambers 308 and the pressure chambers 307 are arranged alternately in the first direction and the second direction.

(Polishing Step)

A polishing step (Step S3) is described. The polishing step is a step of leveling both end faces of the piezoelectric block 303 (faces where the open ends of the pressure chambers 307 are located) by polishing. Abrasive grains are used for the polishing. It is preferred to give the end faces a surface roughness Ra of about 0.4 μm for subsequent electrode forming steps. It is also preferred to give each end face a levelness within 10 μm and to set the parallelism between the end faces to 30 μm or less in order to bond the orifice plate 304 and the rear throttle plate 302 with precision.

(Front End Face Electrode Forming Step)

Figure 15:
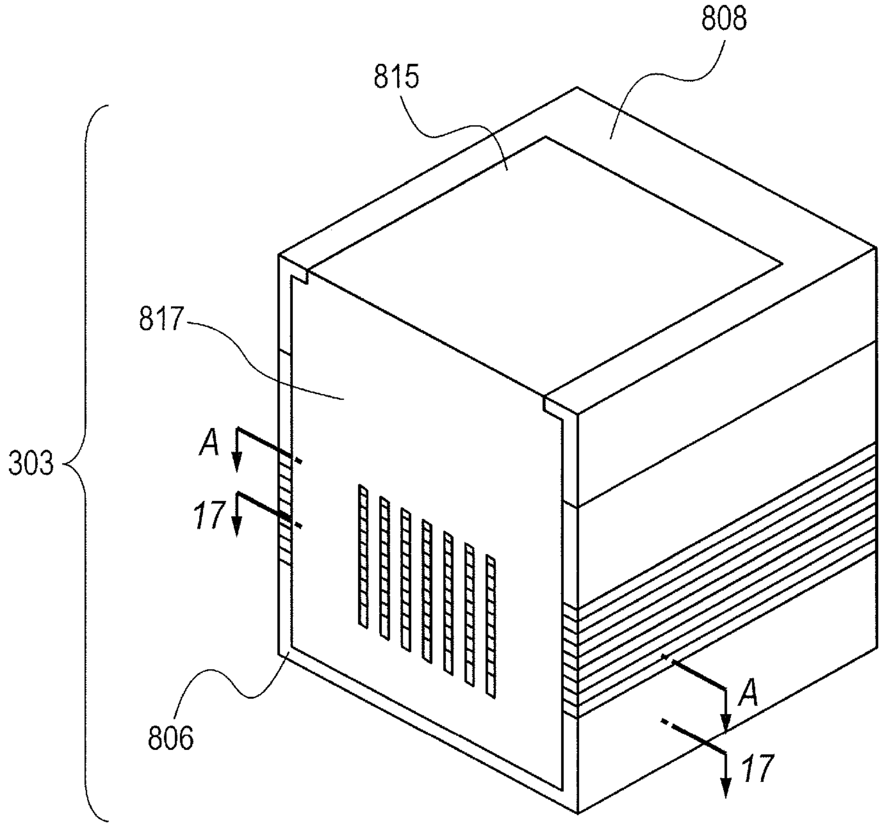
FIG. 15 is a perspective view illustrating an end face electrode forming step.
Figure 16A:
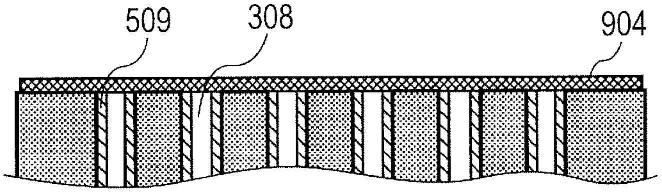
FIGS. 16A, 16B, 16C, and 16D are sectional views taken along the line A-A of FIG. 15.
Figure 16B:
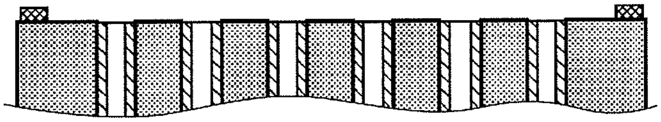
Figure 16C:
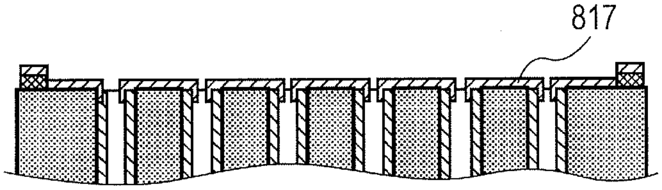
Figure 16D:
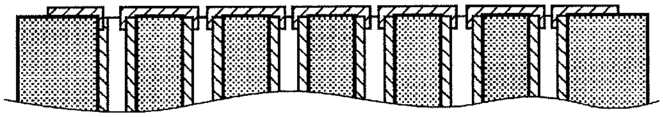
Figure 17:
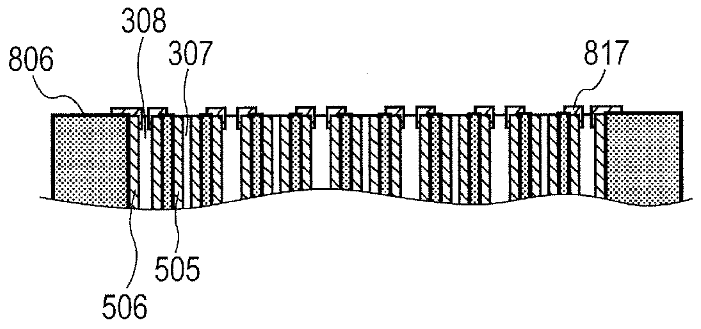
FIG. 17 is a sectional view taken along the line 17-17 of FIG. 15.

A front end face electrode forming step (Step S4) is described. The front end face electrode forming step is a step of forming, on a front end face of the piezoelectric block 303 (a face where ink flows out of the open ends of the pressure chambers 307), a wiring pattern that is electrically connected to the electrodes provided in the respective air chambers 308. FIG. 15 is a perspective view illustrating the front end face electrode forming step. Wiring 817 illustrated in FIG. 15 is formed on a front end face 806 of the piezoelectric block 303. A method of patterning the wiring 817 is described with reference to FIGS. 16A to 16D. FIGS. 16A to 16D are sectional views taken along the line A-A of FIG. 15. First, a film resist 904 is stacked on the front end face 806 of the piezoelectric block 303 as illustrated in FIG. 16A. Exposure and development are conducted next to expose the air chambers 308 and the peripheries of the air chambers 308 (see FIG. 16B). At this point, the pressure chambers 307 and the peripheries of the pressure chambers 307 are covered with the film resist 904. The wiring 817 is further formed as illustrated in FIG. 16C. The wiring 817 is thus electrically connected to the second electrodes 506 and the third electrode 508. At this point, a film is formed with the use of a mask also on a top face 808 (see FIG. 15) of the piezoelectric block 303, to thereby form a packaged wiring connecting portion 815. The film resist 904 is then removed as illustrated in FIG. 16D, with the result that the wiring 817 is patterned to have a desired pattern by lift-off. FIG. 17 is a sectional view taken along the line 17-17 of FIG. 15. The wiring 817 is electrically connected to the second electrodes 506 that are formed on the inner walls of the air chambers 308, and is not electrically connected to the first electrodes 505 that are formed on the inner walls of the pressure chambers 307.

The wiring 817 may be structured so that, for example, a Cr layer is formed as a base layer and an Au layer is formed as an electrode layer. To give another example, the wiring 817 may be structured so that a Pd layer is formed on a Cr layer serving as a base layer. The wiring 817 may also have a structure in which a Ni plating film is formed with a Pd layer as a seed layer and Ni on the surface is displaced with Au by displacement plating.

(Rear End Face Electrode Forming Step)

Figure 18:
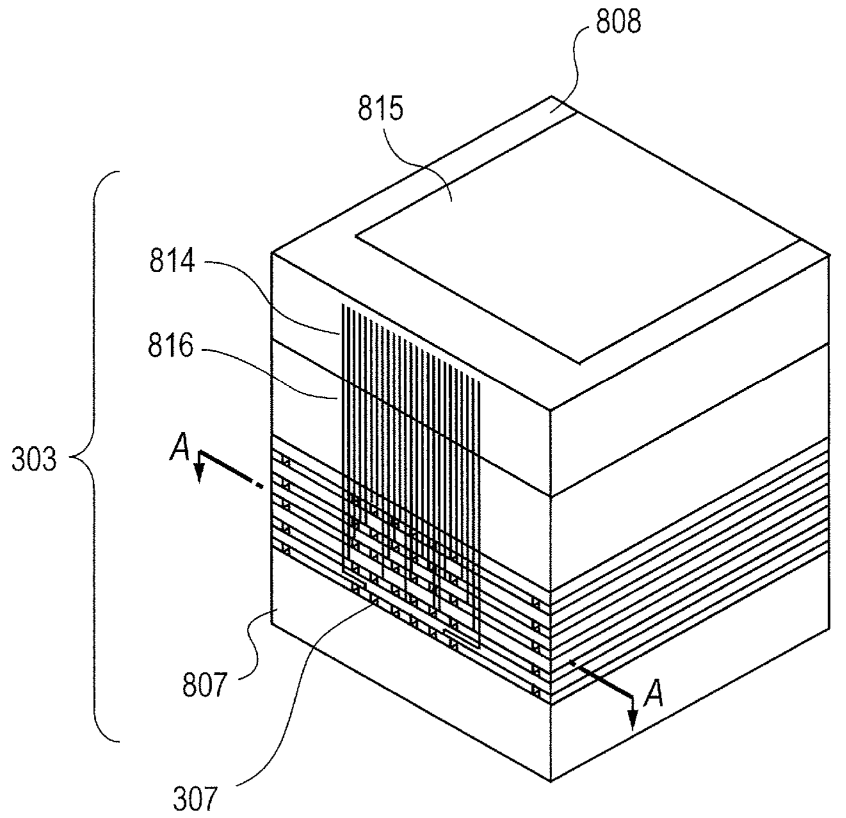
FIG. 18 is a perspective view illustrating a rear-end face electrode forming step.
Figure 19A:
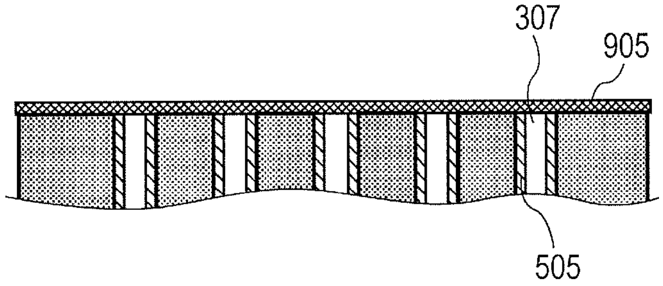
FIGS. 19A, 19B, 19C, and 19D are sectional views taken along the line A-A of FIG. 18.
Figure 19B:
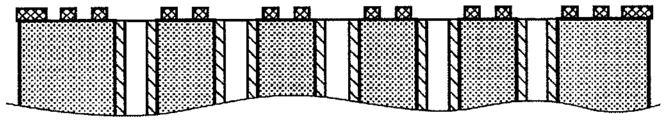
Figure 19C:
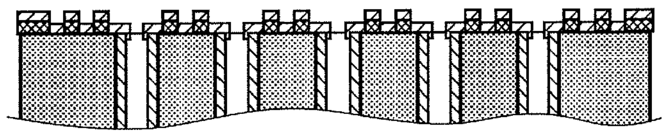
Figure 19D:
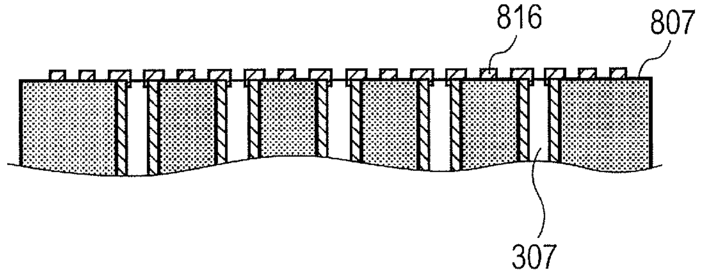

A rear end face electrode forming step (Step S5) is described. The rear end face electrode forming step is a step of forming, on a rear end face 807 of the piezoelectric block 303, a wiring pattern that is electrically connected to the electrodes provided in the respective pressure chambers 307. FIG. 18 is a perspective view illustrating the rear end face electrode forming step. Wiring 816 illustrated in FIG. 18 is electrically connected to the packaged wiring connecting portion 814 formed above the rear end face 807 of the piezoelectric block 303. The wiring 816 is electrically connected to the first flexible substrate 310 via the packaged wiring connecting portion 814 by a step described later. A method of patterning the wiring 816 is described with reference to FIGS. 19A to 19D. FIGS. 19A to 19D are sectional views taken along the line A-A of FIG. 18. First, a film resist 905 is stacked on the rear end face 807 of the piezoelectric block 303 as illustrated in FIG. 19A. Exposure and development are conducted next to expose the pressure chambers 307 and the peripheries of the pressure chambers 307 (see FIG. 19B). The wiring 816 is further formed as illustrated in FIG. 19C. The wiring 816 is thus electrically connected to the first electrodes 505 and the fifth electrode 512. The film resist 905 is then removed as illustrated in FIG. 19D, with the result that the wiring 816 is patterned to have a desired pattern by lift-off. The wiring 816 can have the same structure as that of the wiring 817 described above.

The first electrodes 505 formed on the inner walls of the respective pressure chambers 307 are each individually connected to one wiring line 816. Drive signals are applied to the respective wiring lines 816 to deform the inner walls of the pressure chambers 307 independently of one another.

(Rear Throttle Plate Joining Step)

Figure 20:
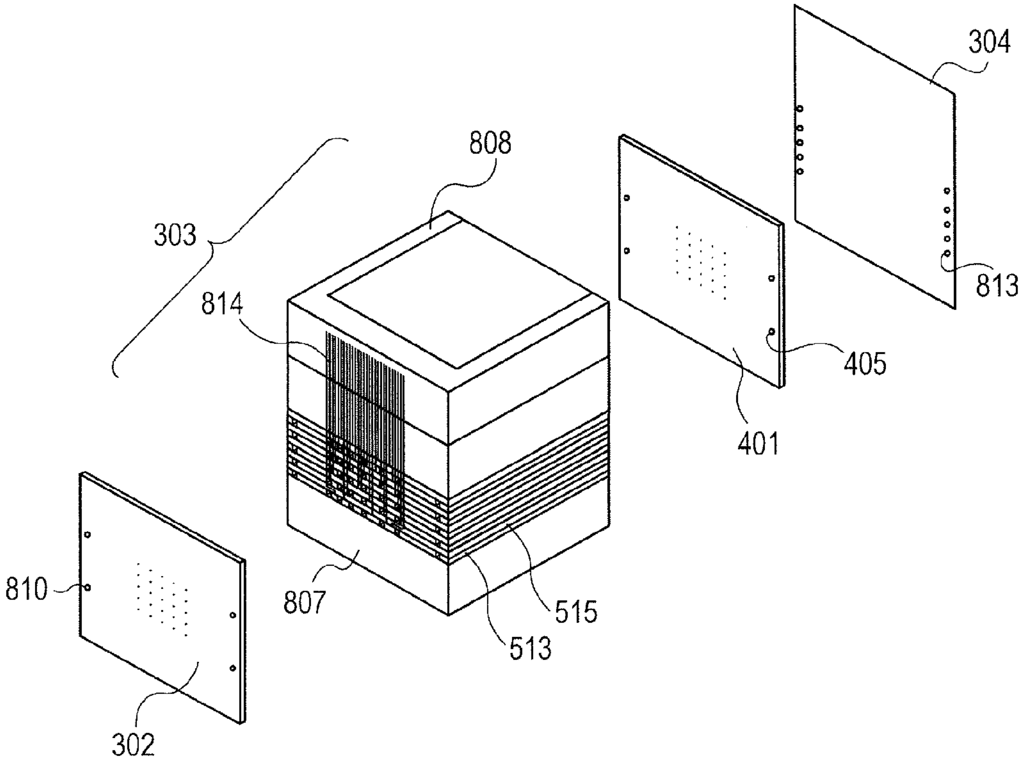
FIG. 20 is a perspective view of the liquid ejection head of Embodiment 1 of the present invention, which is viewed from the back.
Figure 21:
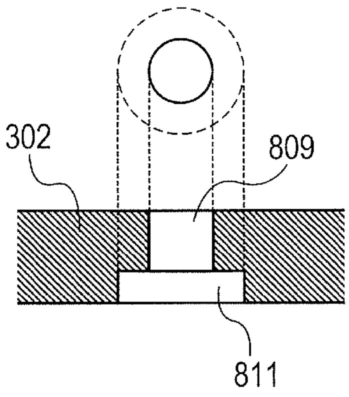
FIG. 21 is a top view and sectional view of a rear throttle plate.

A rear throttle plate joining step (Step S6) is described. FIG. 20 is an exploded perspective view of the liquid ejection head according to this embodiment. The perspective view of FIG. 20 is viewed from the back of the liquid ejection head of this embodiment. FIG. 21 is a top view and sectional view of the rear throttle plate. As illustrated in FIG. 21, the rear throttle plate 302 is provided with multiple openings 809 at points corresponding to the respective pressure chambers 307. The openings 809 are a member for restricting ink from flowing back from the pressure chambers 307. The rear throttle plate 302 in this embodiment is made from a silicon substrate. The openings 809 are formed by etching or the like so as to pierce the rear throttle plate 302. The diameter of each opening 809 is smaller than the diameter of each pressure chamber 307. It is preferred to form an insulating film on the surface of the rear throttle plate 302 by thermal oxidation or the like in advance in order to prevent the wiring lines formed in the piezoelectric block 303 from short-circuiting when the rear throttle plate 302 is joined to the piezoelectric block 303. An epoxy-based adhesive, for example, is used to join the rear throttle plate 302 to the piezoelectric block 303. In order to avoid filling the openings 809 with the adhesive when the rear throttle plate 302 is joined, the amount of the adhesive needs to be controlled appropriately. The adhesive can be applied by forming a thin uniform adhesive layer on another flat substrate through spin coating, screen printing, or the like, pressing a surface to be joined against the adhesive layer, and then pulling the surface away. A thin uniform adhesive layer is thus formed on the piezoelectric block. After the adhesive is applied, the throttle plate and the piezoelectric block are positioned with a minute gap left therebetween, and the throttle plate is then bonded to the piezoelectric block by pressure bonding.

Grooves 811 may be formed outside the openings 809 of the rear throttle plate 302 in order to prevent the adhesive from entering the openings 809.

The alignment grooves for joining 513 (see FIG. 6) and alignment grooves for joining 515 (see FIG. 9) are used as measures for positioning when the rear throttle plate 302 is joined to the piezoelectric block 303. As illustrated in FIG. 20, the rear throttle plate 302 is provided with alignment holes 810 for positioning with respect to the alignment grooves for joining 513 and 515.

The rear throttle plate 302 is bonded to the rear end face 807 of the piezoelectric block 303 so that the packaged wiring connecting portion 814 is exposed.

(Insulating Step)

An insulating step (Step S7) is described. The insulating step is a step of forming an insulating film on the surface of the electrodes that have been formed on the inner walls of the pressure chambers 307, the electrodes that have been formed on the inner walls of the air chambers 308, and the electrode wiring lines. Of the electrode wiring lines, the insulating film is not formed on the packaged wiring connecting portions 814 and 815. The packaged wiring connecting portions 814 and 815 are masked with tape or the like when the insulating film is formed. The insulating film is, for example, a thin film of parylene and is formed by chemical vapor deposition (CVD). Before the parylene film is formed, UV ozone treatment may be performed at room temperature for about five minutes in order to improve the adhesion of the parylene film. The adhesion may be enhanced further by applying a coupling agent after the UV ozone treatment.

(Plate-like Member Joining Step)

Figure 22:
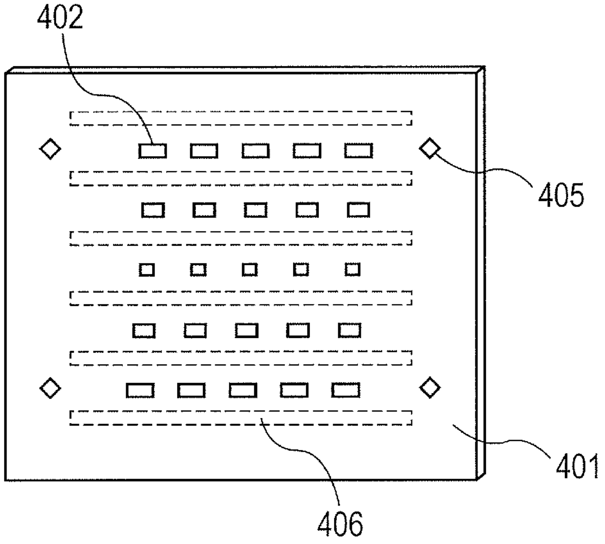
FIG. 22 is a frontal view of a plate-like member.

A plate-like member joining step (Step S8) is described. The plate-like member joining step is a step of joining the plate-like member 401 of FIG. 22 to the front end face 806 of the piezoelectric block 303. FIG. 22 is a frontal view of the plate-like member 401. Multiple flow paths 402 are provided in the plate-like member 401. The flow paths 402 are flow paths by which the pressure chambers 307 individually communicate with the ejection orifices 309. The plate-like member 401 in this embodiment is made from a silicon substrate. The flow paths 402 are formed by opening through-holes in the plate-like member 401 by etching or the like. It is preferred to form an insulating film on the surface of the plate-like member 401 by thermal oxidation or the like in advance in order to prevent the wiring lines formed in the piezoelectric block 303 from short-circuiting when the plate-like member 401 is joined to the piezoelectric block 303. An epoxy-based adhesive, for example, is used to join the plate-like member 401 to the piezoelectric block 303. In order to avoid filling the flow paths 402 with the adhesive when the plate-like member 401 is joined, the amount of the adhesive needs to be controlled appropriately. The adhesive can be applied by forming a thin uniform adhesive layer on another flat substrate through spin coating, screen printing, or the like, pressing a surface to be joined against the adhesive layer, and then pulling the surface away. A thin uniform adhesive layer is thus formed on the piezoelectric block. After the adhesive is applied, the plate-like member and the piezoelectric block are positioned with a minute gap left therebetween, and the plate-like member is then bonded to the piezoelectric block by pressure bonding.

Grooves 406 may be formed around the flow paths 402 in order to prevent the adhesive from entering the flow paths 402 (see FIG. 22).

The alignment grooves for joining 513 (see FIG. 6) and the alignment grooves for joining 515 (see FIG. 9) are used as measures for positioning when the plate-like member 401 is joined to the piezoelectric block 303. As illustrated in FIG. 22, the plate-like member 401 is provided with alignment holes 405 for positioning with respect to the alignment grooves for joining 513 and 515.

(Orifice Plate Joining Step)

Figure 23A:
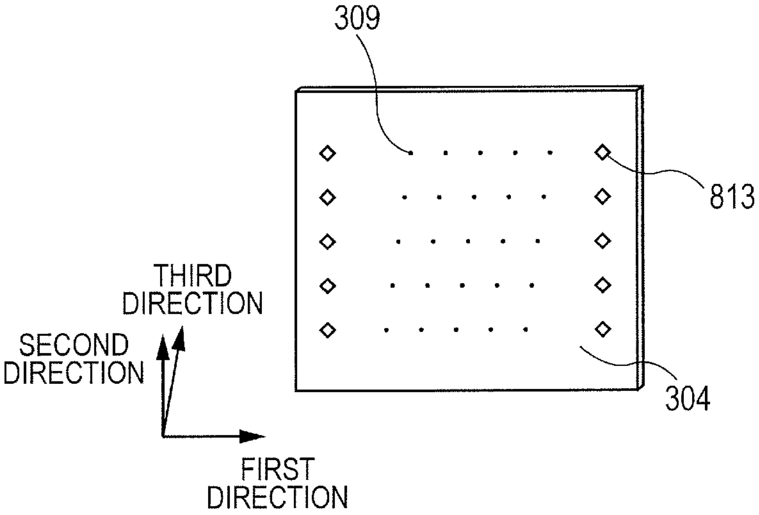
FIGS. 23A and 23B are diagrams illustrating an orifice plate.
Figure 23B:
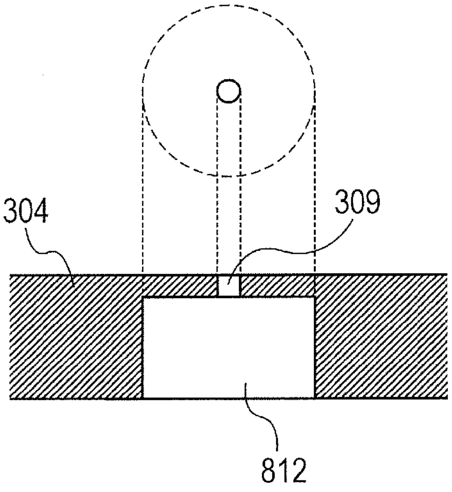

An orifice plate joining step (Step S9) is described. The orifice plate joining step is a step of joining the orifice plate 304 to the plate-like member 401. FIGS. 23A and 23B are diagrams illustrating the orifice plate. FIG. 23A is a perspective view of the orifice plate 304. FIG. 23B is a plan view and sectional view of one of the ejection orifices 309 formed in the orifice plate 304.

Multiple ejection orifices 309 pierce the orifice plate 304. The ejection orifices 309 individually communicate with the respective pressure chambers 307 via the flow paths 402 of the plate-like member 401. Grooves 812 for preventing an adhesive from entering the ejection orifices 309 are provided in the orifice plate 304 on a side where the orifice plate 304 is joined to the plate-like member 401 (see FIG. 23B). The orifice plate 304 can be manufactured by, for example, electroforming of Ni. Ink repellent treatment may further be performed on a face of the orifice plate 304 that is opposite from the one where the orifice plate 304 is joined to the plate-like member 401. Silane-based materials and fluorine-based materials are given as ink repellent material examples, and a film of one of these materials is formed on the orifice plate 304 by vapor deposition or the like.

The orifice plate 304 in this embodiment is joined to the plate-like member 401 with, for example, an adhesive. An epoxy-based adhesive can be given as an example of the adhesive. In order to avoid filling the ejection orifices 309 with the adhesive when the orifice plate 304 is joined, the amount of the adhesive needs to be controlled appropriately. The adhesive can be applied by forming a thin uniform adhesive layer on another flat substrate through spin coating, screen printing, or the like, pressing a surface to be joined against the adhesive layer, and then pulling the surface away. A thin uniform adhesive layer is thus formed on the piezoelectric substrate. After the adhesive is applied, the orifice plate and the plate-like member are positioned with a minute gap left therebetween, and the orifice plate is then bonded to the plate-shaped member by pressure bonding.

As illustrated in FIG. 23A, the orifice plate 304 is provided with alignment holes 813 for positioning with respect to the alignment grooves for joining 513 and 515.

In this embodiment, the piezoelectric substrates are stacked so that the open ends of the pressure chambers 307 on the ejection orifice side are arranged in the first direction and the second direction that intersect each other at right angles as illustrated in FIG. 14. The ejection orifices 309, on the other hand, are arranged in the first direction and a third direction (see FIG. 23A). The third direction is a direction tilted from the second direction. Arranging the ejection orifices 309 in this manner enhances the recording density compared to a mode in which the ejection orifices 309 are arranged orthogonally as the pressure chambers 307 are.

Beading can be reduced by controlling ejection so that ink is not ejected successively from the ejection orifices 309 that are adjacent to one another. "Beading" herein refers to a phenomenon in which a drop of ink ejected first is not given time to be absorbed by a recording medium before the next drop of ink is ejected, and the resultant mixture of the ink drops causes density unevenness.

(Wiring/Packaging Step)

Figure 24:
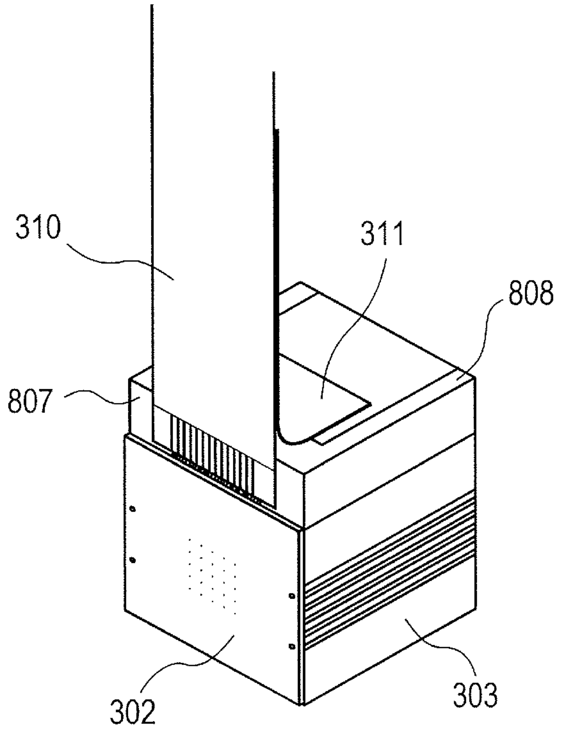
FIG. 24 is a perspective view illustrating a wiring/packaging step.

A wiring/packaging step (Step S10) is described. FIG. 24 is a perspective view illustrating the wiring/packaging step. As illustrated in FIG. 24, in the wiring/packaging step, the first flexible substrate 310 is bonded under pressure to the rear end face 807 of the piezoelectric block 303, and the second flexible substrate 311 is bonded under pressure to the top face 808 of the piezoelectric block 303. An anisotropic conductive film is used for the bonding under pressure. After the bonding under pressure, areas around where the respective flexible substrates are joined to the piezoelectric block 303 are reinforced with an adhesive.

(Common Liquid Chamber Joining Step)

A common liquid chamber joining step (Step S11) is described. After the wiring/packaging step, the common liquid chamber 301 having an ink supply port 305 (see FIG. 1) is joined to the rear throttle plate 302. The common liquid chamber 301 in this embodiment is made from a stainless steel substrate. The ink supply port 305 is formed by machining. The common liquid chamber 301 is joined to the rear throttle plate 302 with an adhesive.

Lastly, other necessary components are assembled to complete the liquid ejection head.

(Driving)

Figure 25A:
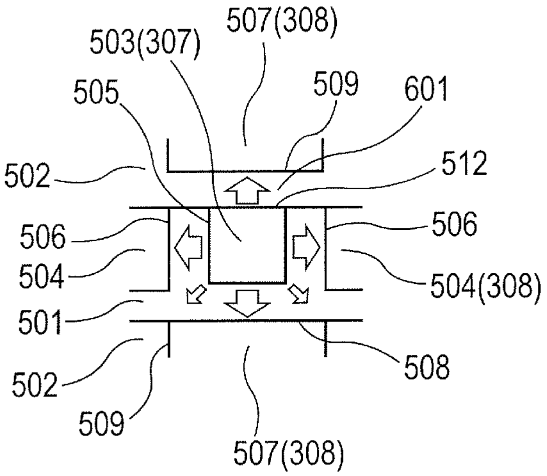
FIGS. 25A and 25B are enlarged views of a region R of FIG. 12B.
Figure 25B:
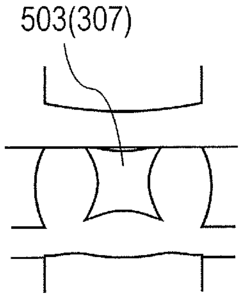

The operation of driving the piezoelectric block 303 is described next. FIGS. 25A and 25B are enlarged views of a region R illustrated in FIG. 12B. As illustrated in FIG. 25A, each pressure chamber 307 (first groove 503) is defined by the air chambers 308 (the second grooves 504 and the third grooves 507) so that the chambers form a two-dimensional array pattern. The pressure chamber 307 is polarized in an outward polarization direction 601. FIG. 25B illustrates how the pressure chamber 307 looks when voltage is applied. The voltage is applied between the electrodes with the first electrode 505 and the fifth electrode 512 that are formed on the inner walls of the pressure chamber 307 given a positive electric potential, and the second electrodes 506, the third electrode 508, and the fourth electrode 509 that are formed on the inner walls of the air chambers 308 given a ground electric potential. The voltage application causes the pressure chamber 307 to deform by shrinking in a manner illustrated in FIG. 25B. The shrinking deformation enhances the pressure of ink filling the pressure chamber 307. As a result, the ink flows out of the open end of the pressure chamber 307. The flowing ink runs along the relevant flow path 402 to be ejected from the relevant ejection orifice 309. On the other hand, the pressure chamber 307 deforms by expanding when drive voltage is applied with the first electrode 505 and the fifth electrode 512 given a GND electric potential, and the second electrodes 506, the third electrode 508, and the fourth electrode 509 given a positive electric potential (not shown).

Figure 26:
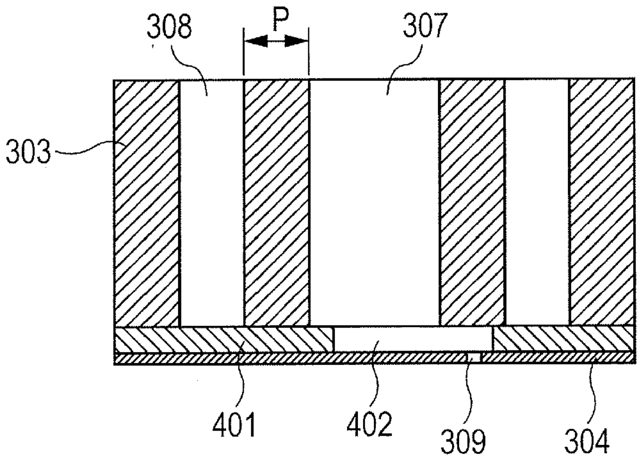
FIG. 26 is a sectional view illustrating how the piezoelectric block, the plate-like member, and the orifice plate are joined to one another.

In the liquid ejection head of this embodiment, how the ejection orifices 309 are arranged does not match how the pressure chambers 307 are arranged as described above. However, the flow paths 402 formed in the plate-like member 401 allow the pressure chambers 307 and the ejection orifices 309 to communicate with each other as illustrated in FIG. 26. The liquid ejection head can thus eject ink from the ejection orifices 309 despite the fact that how the ejection orifices 309 are arranged does not match how the pressure chambers 307 are arranged. FIG. 26 is a sectional view illustrating the piezoelectric block 303, the plate-like member 401, and the orifice plate 304 that have been joined to one another. The flow paths 402 do not communicate with the pressure chambers 307 as illustrated in FIG. 26.

Figure 27:
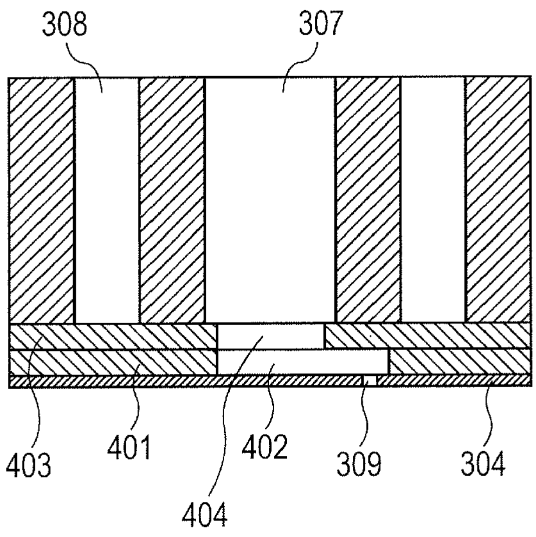
FIG. 27 is a sectional view illustrating a mode in which two plate-like members are used.

In the case where a gap P (see FIG. 26) between one pressure chamber 307 and one air chamber 308 is narrow, a plate-like member 403 illustrated in FIG. 27 may be inserted between the piezoelectric block 303 and the plate-like member 401 so that only the pressure chambers 307 and the ejection orifices 309 communicate with one another. The plate-like member 403 is pierced by flow paths 404, which communicate with the flow paths 402. The diameter of each flow path 404 is smaller than the diameter of each flow path 402.

Other than stacking the two plate-like members 401 and 403, a form similar to the one illustrated in FIG. 27 can be manufactured with one plate-like member by adjusting the depth of the flow paths 402 through counterboring or the like.

(Embodiment 2)

Figure 28:
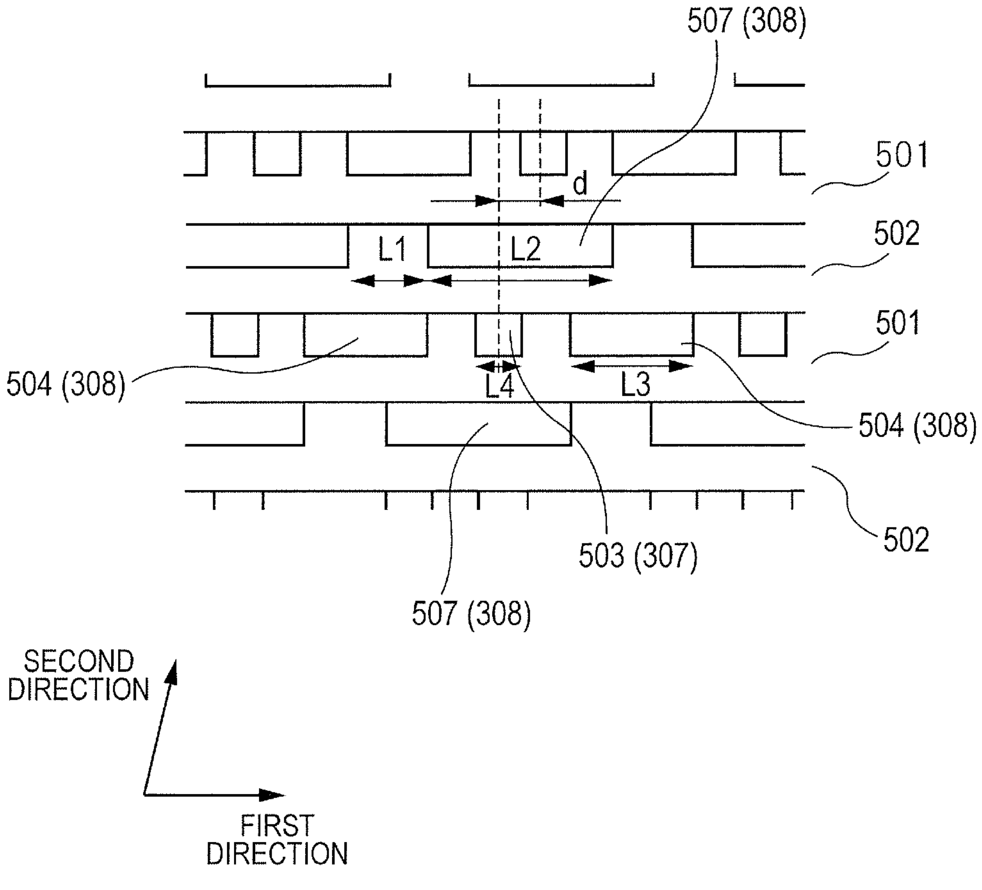
FIG. 28 is a sectional view illustrating the structure of a principal part of a liquid ejection head according to Embodiment 2 of the present invention.

Embodiment 2 of the present invention is described. The following description focuses on differences from the first embodiment described above. FIG. 28 is a sectional view illustrating the structure of a principal part of a liquid ejection head according to Embodiment 2. In Embodiment 2, components similar to those described in Embodiment 1 are denoted by the same reference symbols that are used in Embodiment 1, and detailed descriptions thereof are omitted.

The liquid ejection head of Embodiment 2 is, similarly to the liquid ejection head of Embodiment 1, manufactured by following the steps of the flow chart of FIG. 3. In the stacking step (Step S2) of Embodiment 1, the first piezoelectric substrate 501 and the second piezoelectric substrate 502 are stacked so that the pressure chambers 307 are arranged orthogonally. In this embodiment, on the other hand, the center of the open end of each pressure chamber 307 on the ejection orifice side is shifted in the first direction from the center of the open end of the pressure chamber that is adjacent to the pressure chamber in the second direction.

Arranging the pressure chambers 307 in the manner described above makes the flow paths 402 of the plate-like member 401 shorter than in Embodiment 1. The resistance of the flow paths 402 can accordingly be kept low.

In this embodiment, an opening width L2 in the first direction of each air chamber 308 of the second piezoelectric substrate 502 needs to be wider than in Embodiment 1 in order to secure the displacement between the pressure chambers 307 that are adjacent to each other. Specifically, it is preferred for each pressure chamber 307 to satisfy the following Expression (1) when the displacement amount of the center of the pressure chamber 307 is represented by d (see FIG. 28) and the opening width of the pressure chamber 307 in the first direction is represented by L4 (see FIG. 28).

$$L2>L4+d \tag{1}$$

However, when the opening width L2 described above is wide, a gap L1 between two air chambers each having the opening width L2 is narrow. The gap L1 that is narrow decreases the rigidity of the piezoelectric block 303. In particular, the narrow gap L1 decreases the rigidity of the second piezoelectric substrate 502 and makes the piezoelectric substrate susceptible to breakage in the electrode forming step and the stacking step. As the displacement amount d becomes larger, the drop in the rigidity of the piezoelectric block 303 is more noticeable. The drop in the rigidity of the piezoelectric block 303 also becomes noticeable as an opening width L3 in the first direction becomes narrower in each air chamber 308 of the first piezoelectric substrate 501. The displacement amount d is therefore preferred to be small. For instance, it is preferred if the displacement amount d satisfies the following Expression (2):

$$d<L3-L1 \text{ (or } L3>L1+d) \tag{2}$$

When Expression (2) is satisfied, high-density recording can be accomplished while the rigidity of the piezoelectric block 303 is secured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-140703 filed Jun. 22, 2012 which is hereby incorporated by reference herein in its entirety.

What is claimed is:

1. A liquid ejection head, comprising:

multiple ejection orifices for ejecting liquid;

multiple pressure chambers that respectively communicate with the ejection orifices, and are arranged in a first direction and a second direction that intersect each other, the multiple pressure chambers comprising first electrodes formed on inner walls of the multiple pressure chambers;

a piezoelectric block comprising the multiple pressure chambers and multiple air chambers, the multiple air chambers being arranged in the first direction and the second direction alternately with the multiple pressure chambers, the multiple air chambers comprising second electrodes formed on inner walls of the multiple air chambers, the inner walls of the respective pressure chambers being deformable by application of voltage between the first electrodes and the second electrodes to cause liquid to flow out of open ends of the respective pressure chambers;

an orifice plate in which the multiple ejection orifices are arranged; and a plate-like member that is interposed between the piezoelectric block and the orifice plate and is pierced by multiple flow paths, the multiple flow paths allowing the open ends of the respective pressure chambers to communicate individually with the respective ejection orifices, wherein a first pressure chamber of the multiple pressure chambers is shifted at its center in the first direction from a second pressure chamber of the multiple pressure chambers that is adjacent to the first pressure chamber in the second direction, and wherein, when a displacement amount of the center is represented by d, an opening width in the first direction of the first pressure chamber is represented by L4, and an opening width in the first direction of a first air chamber of the multiple air chambers that is provided between the first pressure chamber and the second pressure chamber in the second direction is represented by L2, the following expression is satisfied:

$$L2 > L4+d.$$

2. The liquid ejection head according to claim 1, wherein the multiple pressure chambers are arranged in the first direction and the second direction that intersect each other at right angles, and wherein the multiple ejection orifices are arranged in the first direction and a third direction that is tilted from the second direction.

3. The liquid ejection head according to claim 1, wherein, when an opening width in the first direction of a second air chamber of the multiple air chambers that is adjacent to the first pressure chamber in the first direction is represented by L3 and a gap in the first direction between two of the multiple air chambers both having the opening width L2 is represented by L1, the displacement amount d, the opening width L3, and the gap L1 satisfy the following expression:

$$d > L3-L1.$$

4. The liquid ejection head according to claim 1, wherein the respective flow paths of the plate-like member do not communicate with the multiple air chambers.

5. The liquid ejection head according to claim 1, wherein the piezoelectric block comprises the air chambers formed side by side with the pressure chambers.

6. A method of manufacturing a liquid ejection head comprising multiple ejection orifices for ejecting liquid, and multiple pressure chambers that respectively communicate with the ejection orifices, and are arranged in a first direction and a second direction that intersect each other, the method comprising:

forming multiple first grooves and multiple second grooves alternately in the first direction on a first piezoelectric substrate, the multiple first grooves constituting the multiple pressure chambers, the multiple second grooves extending in parallel with the multiple first grooves;

forming multiple third grooves on a second piezoelectric substrate;

stacking a plurality of the first piezoelectric substrates and a plurality of the second piezoelectric substrates alternately so that the multiple third grooves and the multiple first grooves are arranged alternately in the second direction;

joining a plate-like member to the stacked body of the plurality of the first piezoelectric substrates and the plurality of the second piezoelectric substrates, the plate-like member being pierced by multiple flow paths that individually communicate with open ends of the multiple pressure chambers; and joining to the plate-like member an orifice plate in which multiple ejection orifices are arranged, the multiple ejection orifices communicating individually with the open ends of the multiple pressure chambers via the multiple flow paths, wherein a first pressure chamber of the multiple pressure chambers is shifted at its center in the first direction from a second pressure chamber of the multiple pressure chambers that is adjacent to the first pressure chamber in the second direction, and wherein, when a displacement amount of the center is represented by d, an opening width in the first direction of the first pressure chamber is represented by L4, and an opening width in the first direction of a first air chamber of the multiple air chambers that is provided between the first pressure chamber and the second pressure chamber in the second direction is represented by L2, the following expression is satisfied:

$$L2 > L4+d.$$

* * * * *